United States Patent
Murasawa et al.

(10) Patent No.: US 7,693,202 B2
(45) Date of Patent: Apr. 6, 2010

(54) SEMICONDUCTOR LASER DEVICE AND METHOD FOR FABRICATING THE SAME

(75) Inventors: Satoshi Murasawa, Hyogo (JP); Toru Takayama, Nara (JP); Hisashi Nakayama, Aichi (JP); Yasuhiro Fujimoto, Okayama (JP); Isao Kidoguchi, Hyogo (JP)

(73) Assignee: Panasonic Corporation, Osaka (JP)

( * ) Notice: Subject to any disclaimer, the term of this patent is extended or adjusted under 35 U.S.C. 154(b) by 237 days.

(21) Appl. No.: 11/918,123

(22) PCT Filed: Dec. 14, 2006

(86) PCT No.: PCT/JP2006/324953
§ 371 (c)(1),
(2), (4) Date: Oct. 10, 2007

(87) PCT Pub. No.: WO2007/116564
PCT Pub. Date: Oct. 18, 2007

(65) Prior Publication Data
US 2009/0086780 A1    Apr. 2, 2009

(30) Foreign Application Priority Data
Mar. 31, 2006    (JP) .............................. 2006-096727

(51) Int. Cl.
*H01S 5/00*    (2006.01)

(52) U.S. Cl. .............. 372/50.121; 372/50.1; 372/50.12; 372/50.122

(58) Field of Classification Search ................ 372/50.1, 372/50.121, 50.122, 68, 50.12
See application file for complete search history.

(56) References Cited

U.S. PATENT DOCUMENTS 5,502,739 A * 3/1996 Kidoguchi et al. ....... 372/45.01

(Continued)

FOREIGN PATENT DOCUMENTS

JP    7-038200    2/1995

(Continued)

OTHER PUBLICATIONS

English translation of International Search Report issued in Patent Application No. PCT/JP2006/324953 dated on Jan. 16, 2007.

*Primary Examiner*—Minsun Harvey
*Assistant Examiner*—Yuanda Zhang
(74) *Attorney, Agent, or Firm*—McDermott Will & Emery LLP

(57) ABSTRACT

In a monolithic dual wavelength laser device in which an infrared laser part 100 and a red laser part 130 are built on one n-type GaAs substrate 101, a p-type first cladding layer 105 of the infrared laser part 100 and a p-type first cladding layer 135 of the red laser part 130 are made of the same material and have different impurity concentrations.

10 Claims, 7 Drawing Sheets

U.S. PATENT DOCUMENTS

| | | | |
|---|---|---|---|
| 6,167,074 A * | 12/2000 | Sun et al. | 372/50.122 |
| 6,546,035 B2 * | 4/2003 | Imafuji et al. | 372/50.12 |
| 6,618,420 B1 * | 9/2003 | Gen-Ei et al. | 372/50.1 |
| 6,771,586 B2 * | 8/2004 | Fujii | 369/121 |
| 7,071,497 B2 * | 7/2006 | Koh | 257/184 |
| 7,274,721 B2 * | 9/2007 | Tatsumi | 372/50.1 |
| 2003/0021320 A1 | 1/2003 | Kan | |
| 2005/0008054 A1 | 1/2005 | Ukai | |
| 2005/0271108 A1 * | 12/2005 | Wada et al. | 372/50.12 |

FOREIGN PATENT DOCUMENTS

| | | |
|---|---|---|
| JP | 11-112083 | 4/1999 |
| JP | 2001-148535 | 5/2001 |
| JP | 2002-305357 | 10/2002 |
| JP | 2003-037331 | 2/2003 |
| JP | 2004-349286 | 12/2004 |

* cited by examiner

SEMICONDUCTOR LASER DEVICE AND METHOD FOR FABRICATING THE SAME

RELATED APPLICATIONS

This application is the U.S. National Phase under 35 U.S.C. § 371 of International Application No. PCT/JP2006/324953, filed on Dec. 14, 2006, which in turn claims the benefit of Japanese Application No. 2006-096727, filed on Mar. 31, 2006, the disclosures of which Applications are incorporated by reference herein.

TECHNICAL FIELD

The present invention relates to a semiconductor laser device, and more particularly, it relates to a semiconductor laser device (including a self-oscillation type device) in which the longitudinal mode is multimode.

BACKGROUND ART

Recently, semiconductor laser devices are frequently used as light sources of optical pickups used in optical recording apparatuses or optical reading apparatuses for recording media such as optical disks and magneto-optical recording disks. The light sources of optical pickups are applied to a variety of fields of recorders, PCs (personal computers) and on-vehicle apparatuses, and the optical disk market has been continuously expanding. In particular, there is a large demand for on-vehicle apparatuses typified by car navigation systems, and the demand for an optical pickup usable for reproducing CDs (compact disks) and DVDs (digital video disks), namely, all kinds of disks, is increasing.

An on-vehicle optical pickup is strongly required of (1) compactness of the optical pickup, (2) suppression of signal degradation (low noise) and (3) a wide range of operation temperature assurance for operating in a temperature range from a low temperature to a high temperature.

First, for attaining (1) compactness of the optical pickup, it is effective to simplify the device by reducing the number of optical components, and as one method useful for this purpose, a monolithic semiconductor laser in which a red semiconductor laser of a 650 nm band for a DVD and an infrared semiconductor laser of a 780 nm band for a CD are integrated on one semiconductor substrate is realized. Thus, a plurality of semiconductor lasers are aggregated on one substrate so as to reduce lead time and cost as well as optical components such as a collimator lens and a beam splitter can be shared by the red semiconductor laser and the infrared semiconductor laser, and hence this method is useful for attaining the compactness.

Next, with respect to (2) suppression of signal degradation (low noise), a factor for causing noise will be first described. When a semiconductor laser is used as a light source of an optical disk system, laser beams collected on an optical disk are reflected on the surface of the optical disk so as to be fed back to an end face for emitting laser. In this case, the optical disk functions as if it were a complex resonator. An oscillation wavelength of the longitudinal mode depending upon a complex resonator and an oscillation wavelength of the longitudinal mode depending upon a resonator face of the semiconductor laser itself are different because the length of the optical path is different between these resonators. Furthermore, the effective end face reflectance caused by the complex resonator effect is varied depending upon the length of the optical path. Therefore, in a given operation state, the value of an oscillation threshold current of the longitudinal mode depending upon the complex resonator is smaller than the value of an oscillation threshold current of the longitudinal mode depending upon the laser itself, and as a result, the oscillation mode may be exchanged. At this point, mode competition is caused in the longitudinal mode by feedback light reflected on the optical disk, so as to make the optical output unstable, resulting in causing noise. Such noise is designated as external feedback noise. When the amplitude, calculated as relative intensity noise (RIN), of this noise exceeds −120 dB/Hz, there arises a practical problem.

In order to reduce the external feedback noise in a semiconductor laser, it is effective to operate the semiconductor laser in multi longitudinal mode. The operation in the multi longitudinal mode means a laser oscillation state in which the wavelength for causing laser oscillation (oscillation wavelength) is not a single wavelength but includes a plurality of oscillation wavelengths. When the semiconductor laser is operated in the multi longitudinal mode, the mode competition is minimally caused, and excessive noise can be avoided, and therefore, a low noise characteristic minimally affected by feedback light reflected on an optical disk can be realized.

In order to cause multimode oscillation, a semiconductor laser is operated in the form of pulse. In order to operate the semiconductor laser in the form of pulse, the laser is pulse-driven by using a high-frequency superimposed circuit. In this case, however, an additional driving circuit is necessary, which increases the number of components and hence is disadvantageous for the compactness or the cost of the optical pickup. Furthermore, a recent car includes a large number of accessories using high frequencies (such as an ETC (electronic toll collection) system) apart from a high frequency superimposed module for rapidly modulating the semiconductor laser device. Therefore, it is apprehended that a problem such as malfunction of equipment derived from frequency resonance between these equipment may be caused. Accordingly, this method for rapidly modulating the semiconductor laser device cannot be the best method.

In order to drive a laser in the form of pulse without using a high frequency superimposed circuit, it is effective to use a self oscillation phenomenon of the semiconductor laser. In a self oscillation type laser, it is necessary to form a saturable absorber whose absorption region for a laser beam formed in a waveguide is excited by the laser beam itself so as to reduce the light absorption and to ultimately become transparent (absorption saturated). When the absorber becomes transparent, the loss of the waveguide is reduced and the optical output is abruptly increased. When the optical output is increased, the number of carriers consumed in an active layer on stimulated emission is increased, and hence the carriers are abruptly lost, and ultimately the number of carriers becomes so small that the laser oscillation is halted. Therefore, the optical output of the self oscillation type laser is operated in the form of pulse with respect to time even when it is operated with a DC bias, and thus, the multi longitudinal mode oscillation is attained. Moreover, in the semiconductor laser operated in the self oscillation manner, the carrier density in the active layer is oscillated with time, and hence, the refractive index of the active layer is varied with time. When the refractive index of the active layer is varied, the emission wavelength is also varied. Therefore, the line widths of respective oscillation spectra are increased, so that interference with the feedback light reflected on an optical disk can be reduced. In this manner, for (2) suppression of signal degradation (low noise), a self oscillation type laser is significant as a compact light source with small noise in which excessive noise can be reduced without using a high frequency superimposed circuit.

Next, for (3) a wide range of operation temperature assurance, it is necessary to improve the temperature characteristic of the semiconductor laser device itself. As one method for this purpose, a method described in Patent Document 1 is known. Patent Document 1 describes that the temperature characteristic of a semiconductor laser device is improved by setting the impurity concentration in a cladding layer to $8 \times 10^{17}$ cm$^{-3}$ or more.

Patent Document 1: Japanese Patent Application Laid Open Gazette No. 7-38200

DISCLOSURE OF THE INVENTION

Problems to be Solved by the Invention

As described above, for attaining the (1) compactness of an optical pickup and the (2) suppression of signal degradation (low noise), there is a demand for application of a self oscillation type laser to an integrated semiconductor laser device (such as a dual wavelength semiconductor laser device).

However, for the (3) wide range of operation temperature assurance, when the impurity concentration in a cladding layer is set to $8 \times 10^{17}$ cm$^{-3}$ or more as described in Patent Document 1, although the temperature characteristic becomes better at a high temperature, there arises a problem that stable self oscillation cannot be attained. Furthermore, when the impurity concentration in the cladding layer is high, the impurity is diffused into the active layer due to thermal history during the fabrication of the laser device, which harmfully affects the reliability.

In consideration of these conventional disadvantages, an object of the invention is providing, as an integrated semiconductor laser device, a semiconductor laser device in which the longitudinal mode can stably retain a multimode oscillation (including self oscillation) characteristic, a temperature characteristic and reliability in a wide temperature range from a low temperature to a high temperature.

Means for Solving the Problems

In order to achieve the object, the present inventors examined the reason why the self oscillation becomes unstable when the impurity concentration in a cladding layer is set to be high as described in Patent Document 1, resulting in finding the following:

In a self oscillation type laser, since it is necessary to form a saturable absorber in a waveguide as described above, the saturable absorber is generally formed in an active layer. In this case, the saturable absorber is formed in the active layer in a portion disposed beneath a current confining layer by expanding a light distribution of guided light propagating through the waveguide laterally largely to the portion of the active layer disposed beneath the current confining layer. This portion of the active layer disposed beneath the current confining layer initially works as an absorber for laser beams, but since electron-hole pairs are formed in the active layer through excitement by the laser beams themselves, the light absorption is gradually reduced. When the light absorption is reduced, the waveguide loss is reduced and hence the optical output is increased. Therefore, a larger number of electron-hole pairs are excited in the portion of the active layer disposed beneath the current confining layer, and hence the light absorption is further reduced, and ultimately, the absorber becomes transparent against the laser beams. As a result, the optical output is abruptly increased, and the optical output is increased in the form of pulse. When the optical output is thus increased, the excited electron-hole pairs are lost through recombination derived from the induced emission, and therefore, the portion of the active layer disposed beneath the current confining layer where the saturable absorber is formed works as the absorber again. As a result, the self oscillation phenomenon in which the optical output is oscillated in the form of pulse with time can be attained.

In this manner, in order to realize a self oscillation type laser, it is significant to make the portion of the active layer disposed beneath the current confining layer work as the saturable absorber. When the impurity concentration in a cladding layer is set to be high as described in Patent Document 1, the diffusion length of carriers is large, and hence, a current is unavoidably expanded to the portion of the active layer disposed beneath the current confining layer. Therefore, such a current makes contribution to the laser oscillation, which makes it difficult or impossible to form the saturable absorber. Thus, a stable self oscillation characteristic is difficult to attain.

Specifically, the present inventors have found that it is necessary to set the impurity concentration in a cladding layer so as to retain stable self oscillation by suppressing current spread (namely, by stably forming a saturable absorber) and to secure a temperature characteristic and reliability.

The present invention was devised on the basis of this finding, and specifically, the semiconductor laser device of this invention includes a first double hetero structure for emitting light of a first wavelength and a second double hetero structure for emitting light of a second wavelength different from the first wavelength provided on one semiconductor substrate of a first conductivity type, and the first double hetero structure includes a first first-conductivity type cladding layer; a first active layer formed on the first first-conductivity type cladding layer; and a first second-conductivity type cladding layer formed on the first active layer, the second double hetero structure includes a second first-conductivity type cladding layer; a second active layer formed on the second first-conductivity type cladding layer; and a second second-conductivity type cladding layer formed on the second active layer, and the first second-conductivity type cladding layer and the second second-conductivity type cladding layer are made of the same material and have different impurity concentrations.

In the semiconductor laser device of this invention, since the second-conductivity type cladding layers have different impurity concentrations in the respective double hetero structures of respective light emitting elements, the impurity concentration in each second-conductivity type cladding layer can be optimized so that stable self oscillation can be kept while suppressing current spread in the lateral direction in the active layer (namely, while stably forming a saturable absorber) and that the temperature characteristic and the reliability can be secured. Accordingly, an integrated type semiconductor laser device including a plurality of semiconductor laser diodes in each of which the longitudinal mode can stably retain a multimode oscillation (including self oscillation) characteristic, a temperature characteristic and reliability in a wide temperature range from a low temperature to a high temperature can be obtained.

In the semiconductor laser device of this invention, the first first-conductivity type cladding layer, the first second-conductivity type cladding layer, the second first-conductivity type cladding layer and the second second-conductivity type cladding layer include AlGaInP, so that the fabrication process for the device can be simplified and that the temperature characteristic of an infrared laser can be improved when the device is a dual wavelength semiconductor laser device including the infrared laser.

In the semiconductor laser device of this invention, when the first active layer includes GaAs and the second active layer includes GaInP, a self oscillation type low-noise laser of dual wavelength of an infrared wavelength and a red wavelength can be obtained with high reproducibility. In this case, assuming that the impurity concentration in the first second-conductivity type cladding layer is Cp1 and that the impurity concentration in the second second-conductivity type cladding layer is Cp2, when there is a relationship of Cp1<Cp2, the impurity concentrations in the second-conductivity type cladding layers of the first and second double hetero structures can be definitely optimized.

In the semiconductor laser device of this invention, assuming that the impurity concentration in the first second-conductivity type cladding layer is Cp1, when there is a relationship of $Cp1<7\times10^{17}$ cm$^{-3}$, the impurity concentration in the second-conductivity type cladding layer of the first double hetero structure can be definitely optimized.

In the semiconductor laser device of this invention, assuming that the impurity concentration in the second second-conductivity type cladding layer is Cp2, when there is a relationship of $1\times10^{17}$ cm$^{-3}$<Cp2<$8\times10^{17}$ cm$^{-3}$, the impurity concentration in the second-conductivity type cladding layer of the second double hetero structure can be definitely optimized.

In the semiconductor laser device of this invention, in the case where the first active layer includes GaAs and the second active layer includes GaInP, assuming that the impurity concentration in the first second-conductivity type cladding layer is Cp1 and that the impurity concentration in the second second-conductivity type cladding layer is Cp2, there is preferably a relationship of $1\times10^{17}$ cm$^{-3}$<Cp1<Cp2<$7\times10^{17}$ cm$^{-3}$. Thus, in a wide temperature range from a low temperature to a high temperature, the longitudinal mode can stably retain a multimode oscillation (including self oscillation) characteristic, a temperature characteristic and reliability in both self oscillation type low-noise lasers of the dual wavelength of the infrared wavelength and the red wavelength.

In the semiconductor laser device of this invention, when a first ridge is formed in the first second-conductivity type cladding layer, a second ridge is formed in the second second-conductivity type cladding layer and a current confining layer is formed on sidewalls of the first ridge and the second ridge, light can be definitely confined in the horizontal lateral direction in each of the first and second double hetero structures.

The method of this invention for fabricating a semiconductor laser device in which a plurality of light emitting elements for emitting light of different wavelengths are integrated on a semiconductor substrate of a first conductivity type, includes the steps of successively forming a first-conductivity type cladding layer, an active layer and a second-conductivity type cladding layer in each of regions for forming the plurality of light emitting elements on the semiconductor substrate of the first conductivity type; and forming a ridge by patterning, into a mesa shape, the second-conductivity type cladding layer of each of the plurality of light emitting elements, and the second-conductivity type cladding layers of the plurality of light emitting elements are made of the same material and have different impurity concentrations.

In other words, the method for fabricating a semiconductor laser device of this invention is a method for fabricating the first semiconductor laser device of this invention, and hence, the aforementioned effects can be attained.

EFFECT OF THE INVENTION

According to the present invention, a semiconductor laser device in which the longitudinal mode can stably retain a multimode oscillation (including self oscillation) characteristic, a temperature characteristic and reliability in a wide temperature range from a low temperature to a high temperature can be provided as an integrated semiconductor laser device.

DESCRIPTION OF REFERENCE NUMERALS

Figure 1A:
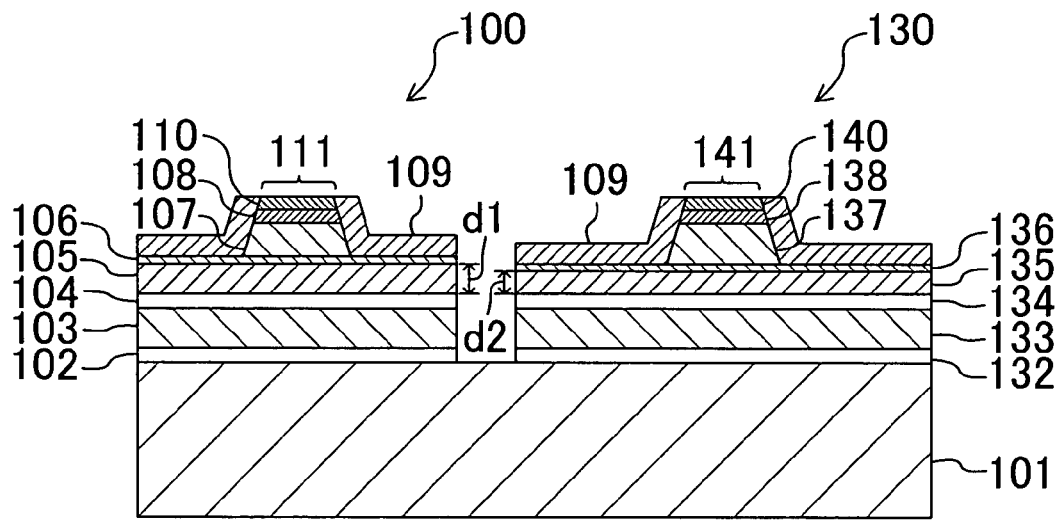
FIG. 1A is a schematic diagram for showing the cross-sectional structure of a semiconductor laser device according to Embodiment 1 of the invention.

100 infrared laser part
101 n-type GaAs substrate
102 n-type GaAs buffer layer
103 n-type (AlGa)InP first cladding layer 104 active layer
1040g (AlGa)InP first guiding layer
1041w GaAs first well layer
1042b (AlGa)InP first barrier layer
1043w GaAs second well layer
1044b (AlGa)InP second barrier layer
1045w GaAs third well layer
1046g (AlGa)InP second guiding layer
105 p-type (AlGa)InP first cladding layer
106 p-type GaInP etching stopper layer
107 p-type (AlGa)InP second cladding layer
108 p-type GaInP intermediate layer
109 n-type GaAs current confining layer
110 p-type GaAs contact layer
111 ridge stripe
130 red laser part
132 n-type GaAs buffer layer
133 n-type (AlGa)InP cladding layer
134 active layer
1340g (AlGa)InP first guiding layer
1341w GaInP first well layer,
1342b (AlGa)InP first barrier layer
1343w GaInP second well layer
1344b (AlGa)InP second barrier layer
1345w GaInP third well layer
1346b (AlGa)InP third barrier layer
1347w GaInP fourth well layer
1348b (AlGa)InP fourth barrier layer
1349w GaInP fifth well layer
1350g (AlGa)InP second guiding layer
135 p-type (AlGa)InP first cladding layer
136 p-type GaInP etching stopper layer
137 p-type (AlGa)InP second cladding layer
138 p-type GaInP intermediate layer
140 p-type GaAs contact layer
141 ridge stripe
501 resist pattern
502 resist pattern
503 silicon oxide film

BEST MODE FOR CARRYING OUT THE INVENTION

Embodiment

Now, a semiconductor laser device and a method for fabricating the same according to an embodiment of the invention will be described with reference to the accompanying drawings.

FIG. 1A is a schematic diagram for showing an exemplified cross-sectional structure of the semiconductor laser device according to the embodiment of the invention. As shown in FIG. 1A, the semiconductor laser device of this embodiment is a monolithic dual wavelength laser device in which an infrared laser part 100 and a red laser part 130 are built on one n-type GaAs substrate 101.

First, in the infrared laser part 100, independently of the red laser part 130, an n-type GaAs buffer layer 102 (with a thickness of 0.4 μm), an n-type (AlGa)InP cladding layer 103 (with a thickness of 2.0 μm), an active layer 104, a p-type (AlGa) InP first cladding layer 105 (with a thickness of 0.83 μm), a p-type GaInP etching stopper layer 106 (with a thickness of 90 Å), a p-type (AlGa)InP second cladding layer 107 (with a thickness of 0.6 μm), a p-type GaInP intermediate layer 108 (with a thickness of 0.1 μm) and a p-type GaAs contact layer 110 (with a thickness of 0.2 μm) are stacked on the n-type GaAs substrate 101 in this order in the upward direction as shown in FIG. 1A. Thus, a double hetero structure in which the active layer 104 is sandwiched between the n-type cladding layer 103 and the p-type cladding layers 105 and 107 is realized.

Figure 1B:
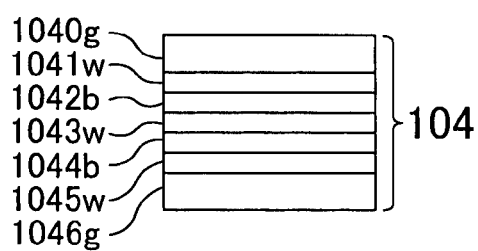
FIG. 1B is a schematic diagram for showing the cross-sectional structure of an active layer of an infrared laser part of the semiconductor laser device of Embodiment 1 of the invention and FIG. 1C is a schematic diagram for showing the cross-sectional structure of an active layer of a red laser part of the semiconductor laser device of Embodiment 1 of the invention.

In this case, the active layer 104 is a quantum well active layer including three well layers as shown in FIG. 1B. Specifically, in the active layer 104, three GaAs well layers 1045w, 1043w and 1041w (each having a thickness of 30 Å and together having a total thickness of 90 Å) stacked in this order in the upward direction respectively sandwich two (AlGa)InP barrier layers 1044b and 1042b (each with a thickness of 50 Å), and the thus formed multilayered structure including the five layers is vertically sandwiched between two (AlGa)InP guiding layers 1040g and 1046g (each with a thickness of 130 Å). In other words, the (AlGa)InP guiding layer 1046g, the GaAs well layer 1045w, the (AlGa)InP barrier layer 1044b, the GaAs well layer 1043w, the (AlGa)InP barrier layer 1042b, the GaAs well layer 1041w and the (AlGa)InP guiding layer 1040g are stacked in this order from a lower side (namely, a side of the n-type (AlGa)InP cladding layer 103). It is noted that the p-type (AlGa)InP first cladding layer 105 is formed on the (AlGa)InP guiding layer 1040g, which is the uppermost layer in the active layer 104.

Furthermore, as shown in FIG. 1A, the p-type (AlGa)InP second cladding layer 107, the p-type GaInP intermediate layer 108 and the p-type GaAs contact layer 110 are formed into a mesa stripe shape as a ridge stripe 111 for confining light in the horizontal lateral direction and for confining a current. An n-type GaAs current confining layer 109 (with a thickness of 0.3 μm) is formed on both sides of the ridge stripe 111, and thus, a current confining structure for confining a region of a current injected into the active layer 104 is formed. Herein, a distance (remaining thickness) from the lower face of the current confining layer 109 (in other words, the lower face of the ridge stripe 111) to the upper face of the active layer 104 is expressed by $d_1$. It is noted that the distance $d_1$ does not include the thickness of the etching stopper layer 106 because the thickness of the etching stopper layer 106 is negligibly small as compared with the thickness of the first cladding layer 105.

The composition ratios of materials of the respective layers of the infrared laser part 100 of this embodiment are, for example, as follows: In the n-type (AlGa)InP cladding layer 103, the p-type (AlGa)InP first cladding layer 105 and the p-type (AlGa)InP second cladding layer 107, the composition ratio is $(Al_{0.7}Ga_{0.3})_{0.51}In_{0.49}P$. Also, in the (AlGa)InP barrier layers 1042b and 1044b included in the active layer 104, the composition ratio is $(Al_{0.4}Ga_{0.6})_{0.51}In_{0.49}P$.

Furthermore, in this embodiment, the width of the bottom of the ridge stripe 111 (namely, the stripe width) of the infrared laser part 100 is 2 μm and the remaining thickness $d_1$ (namely, the thickness of the p-type (AlGa)InP first cladding layer 105) is 0.83 μm.

Next, the red laser part 130 has a basic structure similar to that of the infrared laser part 100. Specifically, in the red laser part 130, independently of the infrared laser part 100, an n-type GaAs buffer layer 132 (with a thickness of 1.2μ), an n-type (AlGa)InP cladding layer 133 (with a thickness of 1.2 μm), an active layer 134, a p-type (AlGa)InP first cladding layer 135 (with a thickness of 0.41 μm), a p-type GaInP etching stopper layer 136 (with a thickness of 60 Å), a p-type (AlGa)InP second cladding layer 137 (with a thickness of 0.58 μm), a p-type GaInP intermediate layer 138 (with a thickness of 0.1 μm) and a p-type GaAs contact layer 140 (with a thickness of 0.2 μm) are stacked in this order in the upward direction on the n-type GaAs substrate 101 shared with the infrared laser part 100 as shown in FIG. 1A. Thus, a double hetero structure in which the active layer 134 is sandwiched between the n-type cladding layer 133 and the p-type cladding layers 135 and 137 is realized.

Figure 1C:
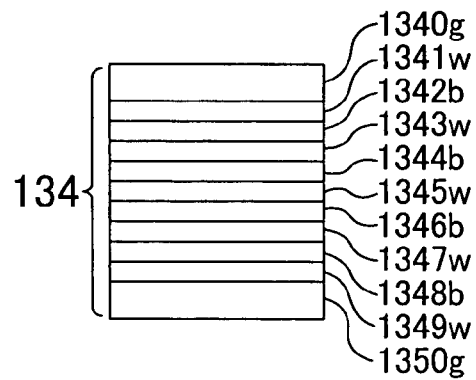
Figure 2A:
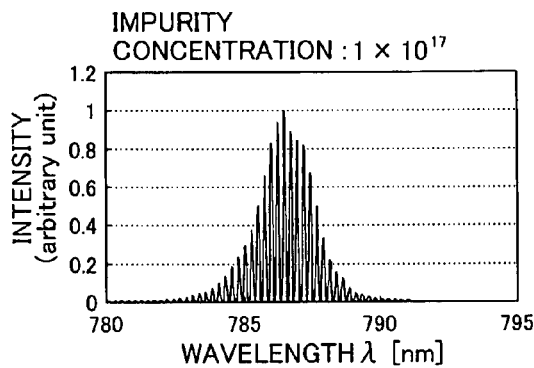
FIGS. 2A through 2D are diagrams for showing oscillation spectrum characteristics obtained by setting an impurity concentration in a p-type first cladding layer of the infrared laser part of the semiconductor laser device of Embodiment 1 of the invention respectively to $1\times10^{17}$ cm$^{-3}$, $4\times10^{17}$ cm$^{-3}$, $7\times10^{17}$ cm$^{-3}$ and $1\times10^{18}$ cm$^{-3}$
Figure 2B:
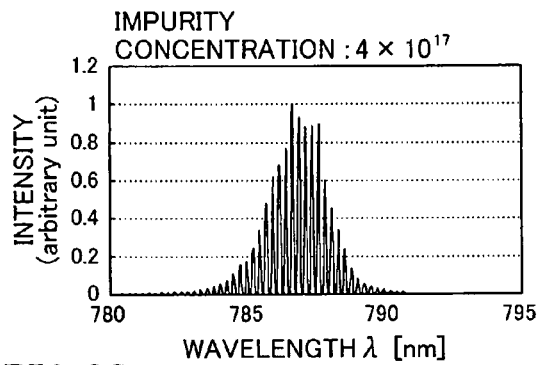
Figure 2C:
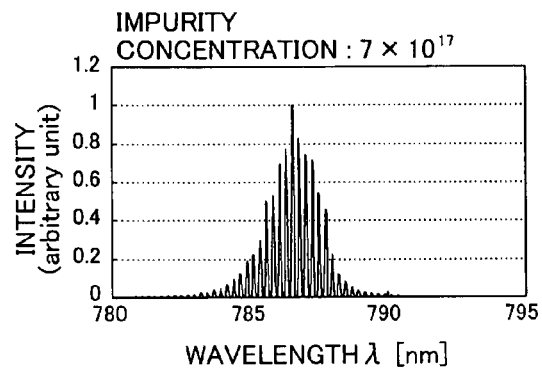
Figure 2D:
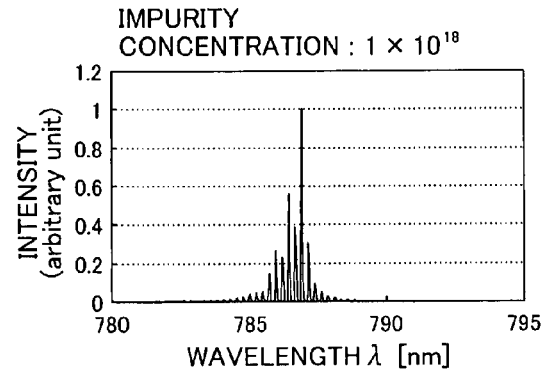
Figure 2E:
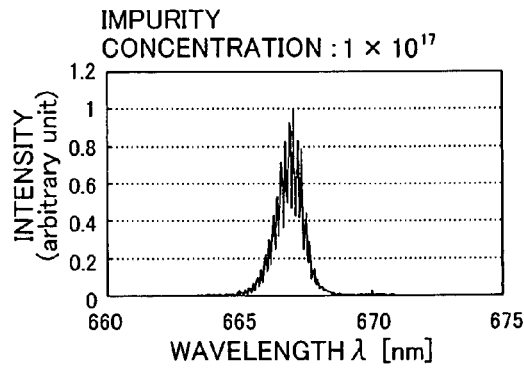
FIGS. 2E through 2H are diagrams for showing oscillation spectrum characteristics obtained by setting an impurity concentration in a p-type first cladding layer of the red laser part of the semiconductor laser device of Embodiment 1 of the invention respectively to $1\times10^{17}$ cm$^{-3}$, $5\times10^{17}$ cm$^{-3}$, $8\times10^{17}$ cm$^{-3}$ and $1\times10^{18}$ cm$^{-3}$.
Figure 2F:
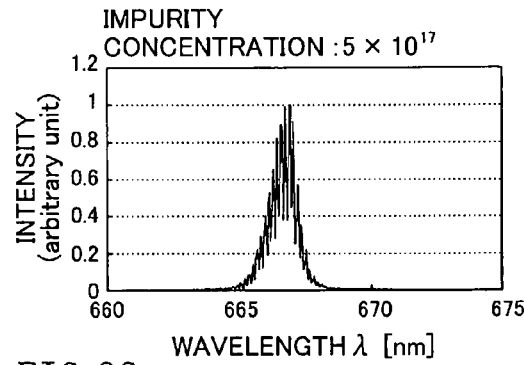
Figure 2G:
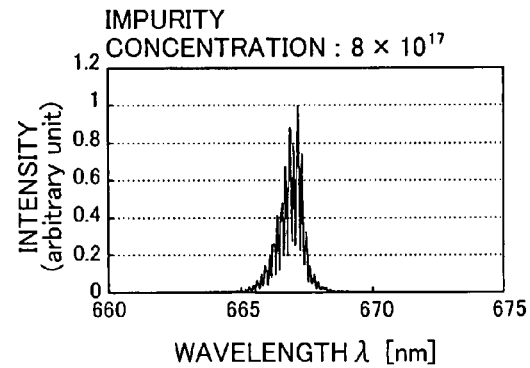
Figure 2H:
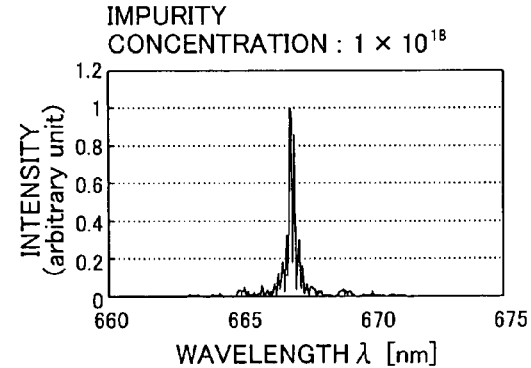

In this case, the active layer 134 is a quantum well active layer including five well layers as shown in FIG. 1C. Specifically, in the active layer 134, five GaInP well layers 1349w, 1347w, 1345w, 1343w and 1341w (each having a thickness of 60 Å and together having a total thickness of 300 Å) stacked in this order in the upward direction respectively sandwich four (AlGa)InP barrier layers 1348b, 1346b, 1344b and 1342b (each with a thickness of 60 Å), and the thus obtained multilayered structure including the nine layers is vertically sandwiched between two (AlGa)InP guiding layers 1350g and 1340g (each with a thickness of 700 Å). In other words, the (AlGa)InP guiding layer 1350g, the GaInP well layer 1349w, the (AlGa)InP barrier layer 1348b, the GaInP well layer 1347w, the (AlGa)InP barrier layer 1346b, the GaInP well layer 1345w, the (AlGa)InP barrier layer 1344b, the GaInP well layer 1343w, the (AlGa)InP barrier layer 1342b, the GaInP well layer 1341w and the (AlGa)InP guiding layer 1340g are stacked in this order from a lower side (namely, a side of the n-type (AlGa)InP cladding layer 133). It is noted that the p-type (AlGa)InP first cladding layer 135 is formed on the (AlGa)InP guiding layer 1340g, which is the uppermost layer in the active layer 134.

Furthermore, similarly to the infrared laser part 100, the p-type (AlGa)InP second cladding layer 137, the p-type GaInP intermediate layer 138 and the p-type GaAs contact layer 140 are formed into a mesa stripe shape as a ridge stripe 141 for confining light in the horizontal lateral direction and for confining a current. An n-type GaAs current confining layer 109 (with a thickness of 0.3 μm) is formed on both sides of the ridge stripe 141, and thus, a current confining structure for confining a region of a current injected into the active layer 134 is formed. Herein, a distance (remaining thickness) from the lower face of the current confining layer 109 (in other words, the lower face of the ridge stripe 141) to the upper face of the active layer 134 is expressed by $d_2$. It is noted that the distance $d_2$ does not include the thickness of the etching stopper layer 136 because the thickness of the etching stopper layer 136 is negligibly small as compared with the thickness of the first cladding layer 135.

The composition ratios of materials of the respective layers included in the red laser part 130 of this embodiment are, for example, as follows: In the n-type (AlGa)InP cladding layer 133, the p-type (AlGa)InP first cladding layer 135 and the p-type (AlGa)InP second cladding layer 137, the composition ratio is $(Al_{0.7}Ga_{0.3})_{0.51}In_{0.49}P$. Also, in the (AlGa)InP guiding layers 1340g and 1350g and the (AlGa)InP barrier layers 1342b, 1344b, 1346b and 1348b included in the active layer 134, the composition ratio is $(Al_{0.5}Ga_{0.5})_{0.51}In_{0.49}P$. Furthermore, in the GaInP well layers 1349w, 1347w, 1345w, 1343w and 1341w included in the active layer 134, the composition ratio is $Ga_{0.43}In_{0.57}P$.

Moreover, in this embodiment, the width of the bottom of the ridge stripe 141 (namely, the stripe width) of the red laser part 130 is 4 μm, and the remaining thickness $d_2$ (namely, the thickness of the p-type (AlGa)InP first cladding layer 135) is 0.41 μm.

In this embodiment, the ridge stripe 111 of the infrared laser part 100 and the ridge stripe 141 of the red laser part 130 are simultaneously formed. Also, the current confining layers 109 are simultaneously formed in the infrared laser part 100 and the red laser part 130.

Moreover, although not shown in the drawings, a p-type electrode is formed on each of the p-type GaAs contact layers 110 and 140 and the current confining layers 109, and n-type electrodes are formed on the back face of the n-type GaAs substrate 101. These p-type electrodes and n-type electrodes are also simultaneously formed in the infrared laser part 100 and the red laser part 130.

In this manner, the semiconductor laser device of this embodiment is a monolithic dual wavelength laser device including the infrared laser part 100 and the red laser part 130.

With respect to this semiconductor laser device, oscillation spectrum characteristics obtained by setting the impurity concentration in the p-type (AlGa)InP first cladding layer 105 of the infrared laser part respectively to $1 \times 10^{17}$ cm$^{-3}$, $4 \times 10^{17}$ cm$^{-3}$, $7 \times 10^{17}$ cm$^{-3}$ and $1 \times 10^{18}$ cm$^{-3}$ are shown in FIGS. 2A through 2D. Also, the oscillation spectrum characteristics obtained by setting the impurity concentration in the p-type (AlGa)InP first cladding layer 135 of the red laser part respectively to $1 \times 10^{17}$ cm$^{-3}$, $5 \times 10^{17}$ cm$^{-3}$, $8 \times 10^{17}$ cm$^{-3}$ and $1 \times 10^{18}$ cm$^{-3}$ are shown in FIGS. 2E through 2H. The measurement is performed in both of the infrared laser part and the red laser part at room temperature with CW (continuous wave) of 5 mW.

It is noted that the impurity implanted into each of the p-type (AlGa)InP first cladding layer 105 and the p-type (AlGa)InP first cladding layer 135 is, for example, Zn or Mg, or both of them. Also, in the case where the impurity concentration is not uniform in each of the p-type (AlGa)InP first cladding layer 105 and the p-type (AlGa)InP first cladding layer 135, an average concentration in each layer is regarded as the impurity concentration in the layer.

As shown in FIGS. 2A through 2D, with respect to the infrared laser, a good multimode characteristic is exhibited when the impurity concentration is 1 through $7 \times 10^{17}$ cm$^{-3}$, and the multimode characteristic is degraded when the impurity concentration is $1 \times 10^{18}$ cm$^{-3}$.

On the other hand, as shown in FIGS. 2E through 2H, with respect to the red laser, the full width at half maximum of the oscillation spectrum is reduced as the impurity concentration is increased, and when the impurity concentration is $1 \times 10^{18}$ cm$^{-3}$, substantially a single mode characteristic is exhibited.

In order to attain multimode oscillation in a high temperature operation performed at 85° C., the full width at half maximum of the oscillation spectrum should be 0.5 nm or more in a room temperature operation. This is because the operation current value is increased at a higher temperature, and hence, a saturable absorber is reduced and a differential gain described later is lowered, so as to make it difficult to cause the self oscillation.

In the experiment results shown in FIGS. 2A through 2H, a difference is caused in the full width at half maximum of the oscillation spectrum between the infrared laser and the red laser and the full width at half maximum of the oscillation spectrum is reduced as the impurity concentration is increased, which will now be described.

Figure 3:
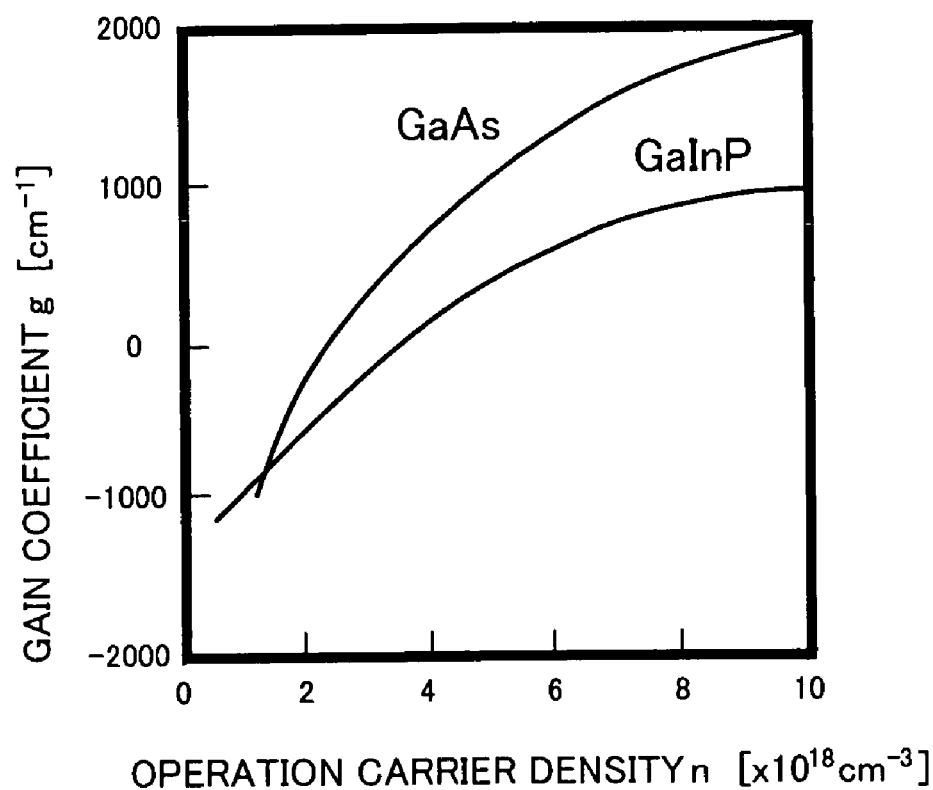
FIG. 3 is a diagram for showing dependency on an operation carrier density n of a gain coefficient g of the active layer of the semiconductor laser device of Embodiment 1 of the invention.

FIG. 3 shows the dependency on an operation carrier density n of a gain coefficient g in an active layer. Specifically, FIG. 3 shows a gain coefficient of GaAs used in the active layer of the infrared laser and a gain coefficient of GaInP used in the active layer of the red laser.

As shown in FIG. 3, the differential gain dg/dn of the GaInP is smaller than the differential gain dg/dn of the GaAs. Smaller differential gain means smaller variation (oscillation) of photon against variation of carrier. In the self oscillation, it is significant to persistently continue the oscillation by increasing the interaction between the carrier and the photon. Accordingly, since the oscillation of the GaInP (i.e., the red laser) having smaller differential gain is smaller than the oscillation of the GaAs (i.e., the infrared laser), the full width at half maximum of the oscillation spectrum of the GaInP (i.e., the red laser) seems to be smaller than that of the GaAs (i.e., the infrared laser).

Furthermore, as shown in FIG. 3, the differential gain of a region with a high operation carrier density n is smaller than the differential gain of a region with a low operation carrier density n. In other words, when an operation current, namely, the operation carrier density n, is increased, the self oscillation is difficult to cause, and therefore, the full width at half maximum of the oscillation spectrum of the region with the high operation carrier density n is smaller than the full width at half maximum of the oscillation spectrum of the region with the low operation carrier density n.

Moreover, in the case where the impurity concentration in the (AlGa)InP first cladding layer is high, carriers are more largely spread within the first cladding layer before being injected into the active layer from the first cladding layer as compared with the case where the impurity concentration is low. Therefore, the saturable absorber is reduced and laser oscillation can be obtained with a small injected current, and hence, peak power of the optical output obtained in the laser oscillation is small. As a result, the number of carriers consumed in the stimulated emission is reduced and the amplitude of the carriers is reduced, and therefore, the number of carriers excited to a higher level is reduced. Accordingly, the full width at half maximum of light that can be oscillated is reduced, so as to reduce a wavelength range (namely, the full width at half maximum of the oscillation spectrum).

In this manner, the amplitude of the oscillation spectrum seems to be determined depending upon the differential gain of the active layer and the impurity concentration in the (AlGa)InP first cladding layer.

Figure 4A:
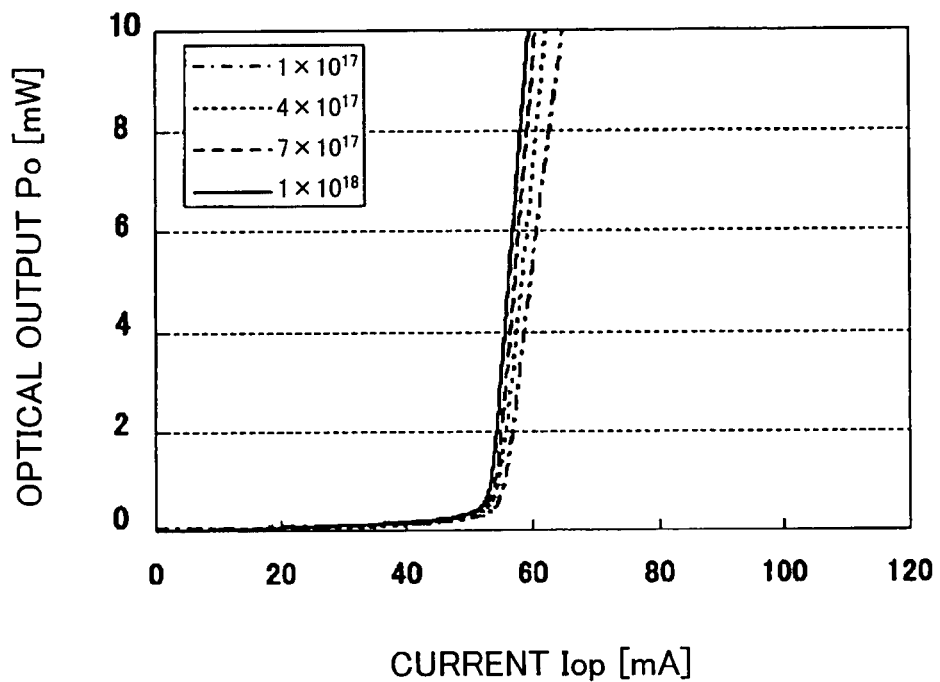
FIG. 4A is a diagram for showing current-optical output characteristics obtained at 85° C. by setting the impurity concentration in the p-type first cladding layer of the infrared laser part of the semiconductor laser device of Embodiment 1 of the invention respectively to $1\times10^{17}$ cm$^{-3}$, $4\times10^{17}$ cm$^{-3}$, $7\times10^{17}$ cm$^{-3}$ and $1\times10^{18}$ cm$^{-3}$
Figure 4B:
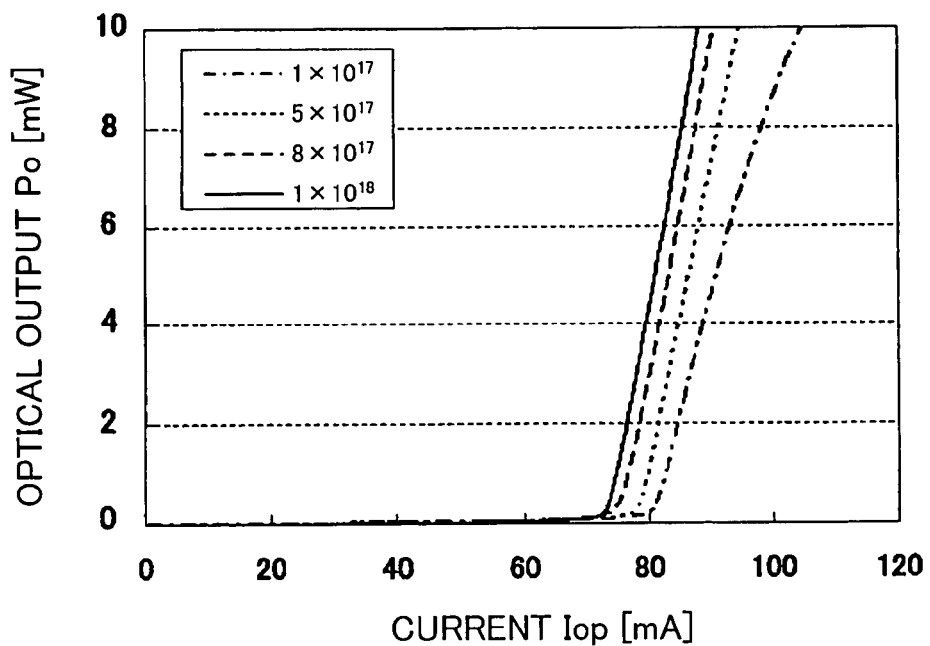
FIG. 4B is a diagram for showing current-optical output characteristics obtained at 85° C. by setting the impurity concentration in the p-type first cladding layer of the red laser part of the semiconductor laser device of Embodiment 1 of the invention respectively to $1\times10^{17}$ cm$^{-3}$, $5\times10^{17}$ cm$^{-3}$, $8\times10^{17}$ cm$^{-3}$ and $1\times10^{18}$ cm$^{-3}$.

FIG. 4A shows current-optical output characteristics obtained at 85° C. by setting the impurity concentration in the p-type (AlGa)InP first cladding layer 105 of the infrared laser part respectively to $1\times10^{17}$ cm$^{-3}$, $4\times10^{17}$ cm$^{-3}$, $7\times10^{17}$ cm$^{-3}$ and $1\times10^{18}$ cm$^{-3}$ in the semiconductor laser device of this embodiment. FIG. 4B shows current-optical output characteristics obtained at 85° C. by setting the impurity concentration in the p-type (AlGa)InP first cladding layer 135 of the red laser part respectively to $1\times10^{17}$ cm$^{-3}$, $5\times10^{17}$ cm$^{-3}$, $8\times10^{17}$ cm$^{-3}$ and $1\times10^{18}$ cm$^{-3}$ in the semiconductor laser device of this embodiment.

As shown in FIG. 4A, with respect to the infrared laser, although the current value is increased as the impurity concentration is reduced, a good current-optical output characteristic free from thermal saturation is obtained when the impurity concentration is 1 through $10\times10^{17}$ cm$^{-3}$. The reason seems to be as follows: Since there is a large band gap difference ΔEg between GaAs of the active layer and AlGaInP of the cladding layer, a leakage current from the active layer to the cladding layer is small, and hence, a good temperature characteristic is exhibited. It is noted that a good temperature characteristic herein means that an optical output is linearly changed, without causing kink, thermal saturation or the like, against a current in the current-optical output characteristic obtained at 85° C.

On the other hand, as shown in FIG. 4B, with respect to the red laser, the current value is largely increased as the impurity concentration is reduced in the same manner as in the infrared laser, and in particular, when the impurity concentration is $1\times10^{17}$ cm$^{-3}$, differential efficiency (Se) is lowered. In this manner, with respect to the red laser, the temperature characteristic is largely affected by the impurity concentration, and the impurity concentration needs to be as high as possible for improving the temperature characteristic.

As is understood from the experiment results of the multimode characteristic shown in FIGS. 2A through 2H and the experiment results of the current-optical output characteristic shown in FIGS. 4A and 4B, it is necessary, in the infrared laser, to satisfy a relationship of the impurity concentration in the p-type (AlGa)InP first cladding layer 105 $<7\times10^{17}$ cm$^{-3}$ from the viewpoint of the multimode characteristic. On the other hand, it is necessary, in the red laser, to satisfy a relationship of the impurity concentration in the p-type (AlGa) InP first cladding layer 135$<8\times10^{17}$ cm$^{-3}$ for realizing a stable multimode characteristic, and to satisfy a relationship of the impurity concentration in the p-type (AlGa)InP first cladding layer 135$>1\times10^{17}$ cm$^{-3}$ for improving the temperature characteristic.

Accordingly, in consideration of the above-described results, for attaining satisfactory multimode characteristic and temperature characteristic with respect to the infrared laser, the relationship of the impurity concentration in the p-type (AlGa)InP first cladding layer 105$<7\times10^{17}$ cm$^{-3}$ is satisfied. Also, for attaining satisfactory multimode characteristic and temperature characteristic with respect to the red laser, a relationship of $1\times10^{17}$ cm$^{-3}$<the impurity concentration in the p-type (AlGa)InP first cladding layer 135 $<8\times10^{17}$ cm$^{-3}$ is satisfied.

Furthermore, in consideration that the laser device of this embodiment is a dual wavelength laser device, a relationship of $1\times10^{17}$ cm$^{-3}$<the impurity concentration in the p-type (AlGa)InP first cladding layer 105 of the infrared laser part<the impurity concentration in the p-type (AlGa)InP first cladding layer 135 of the red laser part<$7\times10^{17}$ cm$^{-3}$ is preferably satisfied. This is because the impurity concentration needs to be as high as possible in the red laser for improving the temperature characteristic while keeping the multimode characteristic but there arises no problem in the infrared laser as far as the impurity concentration is sufficiently high for keeping the multimode characteristic.

In the laser device of this embodiment, there may be a case of $1\times10^{17}$ cm$^{-3}$<the impurity concentration in the p-type (AlGa)InP first cladding layer 135 of the red laser part <the impurity concentration in the p-type (AlGa)InP first cladding layer 105 of the infrared laser part<$7\times10^{17}$ cm$^{-3}$, but this case should be avoided for the following reason: In the infrared laser, since a distance between the upper end of the GaAs well layer 1041w of the active layer 104 and the lower end of the p-type (AlGa)InP first cladding layer 105 (namely, the thickness of 130 Å of the (AlGa)InP guiding layer 1040g) is small, if the impurity concentration in the p-type (AlGa)InP first cladding layer 105 is high, the impurity is diffused into the active layer 104, which degrades the reliability through crystallinity degradation and increase of non-radiative recombination centers, and therefore, the impurity concentration in the p-type (AlGa)InP first cladding layer 105 should be as low as possible. On the other hand, in the red laser, since a distance between the upper end of the GaInP well layer 1341w of the active layer 134 and the lower end of the p-type (AlGa)InP first cladding layer 135 (namely, the thickness of 700 Å of the (AlGa)InP guiding layer 1340g) is large, even if the impurity concentration is high in the p-type (AlGa)InP first cladding layer 135, reliability degradation derived from the diffusion of the impurity into the active layer 134 can be avoided. Accordingly, the impurity concentration in the p-type (AlGa) InP first cladding layer 105 of the infrared laser part should be smaller than the impurity concentration in the p-type (AlGa) InP first cladding layer 135 of the red laser part.

As described so far, in the dual wavelength laser device of this embodiment, in order to attain satisfactory multimode characteristics, temperature characteristics and reliability simultaneously in the red laser and the infrared laser, the relationship of $1\times10^{17}$ cm$^{-3}$<the impurity concentration in the p-type (AlGa)InP first cladding layer 105 of the infrared laser part<the impurity concentration in the p-type (AlGa)InP first cladding layer 135 of the red laser part<$7\times10^{17}$ cm$^{-3}$ is preferably satisfied. Thus, a low-noise laser that can be operated at a high temperature of 85° C. can be obtained.

Now, a method for fabricating a semiconductor laser device according to an embodiment of the invention will be described with reference to the accompanying drawings.

FIGS. 5A through 5C, 6A through 6C and 7 are cross-sectional views for showing procedures in the method for fabricating a semiconductor laser device according to the embodiment of the invention.

Figure 5A:
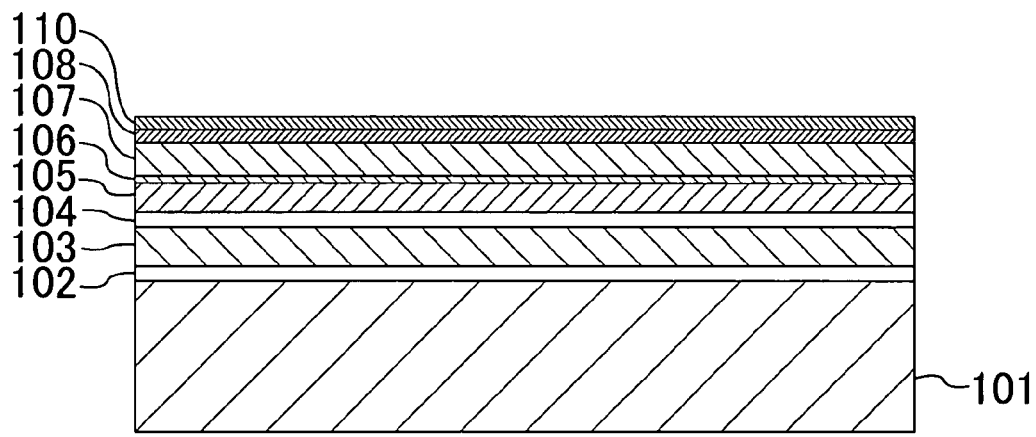
FIGS. 5A through 5C are cross-sectional views for showing procedures in a method for fabricating a semiconductor laser device according to an embodiment of the invention.

First, as shown in FIG. 5A, on an n-type GaAs substrate 101 having, as a principal plane, a plane inclined by 10° from the (100) plane in the [011] direction, an n-type GaAs buffer layer 102 (with a thickness of 0.4 μm), an n-type $(Al_{0.7}Ga_{0.3})_{0.51}In_{0.49}P$ cladding layer 103 (with a thickness of 2.0 μm), a quantum well active layer 104 (specifically, a multi-layered body including an $(Al_{0.4}Ga_{0.6})_{0.51}In_{0.49}P$ guiding layer 1046g (with a thickness of 130 Å), a GaAs well layer 1045w (with a thickness of 30 Å), an $(Al_{0.4}Ga_{0.6})_{0.51}In_{0.49}P$ barrier layer 1044b (with a thickness of 50 Å), a GaAs well layer 1043w (with a thickness of 30 Å), an $(Al_{0.4}Ga_{0.6})_{0.51}In_{0.49}P$ barrier layer 1042b, a GaAs well layer 1041w (with a thickness of 30 Å) and an $(Al_{0.4}Ga_{0.6})_{0.51}In_{0.49}P$ guiding layer 1040g), a p-type $(Al_{0.7}Ga_{0.3})_{0.51}In_{0.49}P$ first cladding layer 105 (with a thickness of 0.83 μm), a p-type GaInP etching stopper layer 106 (with a thickness of 90 Å), a p-type $(Al_{0.7}Ga_{0.3})_{0.51}In_{0.49}P$ second cladding layer 107 (with a thickness of 0.6 μm), a p-type $Ga_{0.51}In_{0.49}P$ intermediate layer 108 (with a thickness of 0.1 μm) and a p-type GaAs contact layer 110 (with a thickness of 0.2 μm) are successively formed by an MOCVD (metal organic chemical vapor deposition) method or an MBE (molecular beam epitaxial) method.

Although a multiple quantum well structure is employed for the active layer 104 in this embodiment, a single-layered quantum well structure or a bulk structure may be employed instead. Also, the conductivity type of the active layer 104 is not particularly specified and the active layer may be a p-type, an n-type or undoped.

Furthermore, as described above, the impurity concentration in the p-type $(Al_{0.7}Ga_{0.3})_{0.51}In_{0.49}P$ first cladding layer 105 of the infrared laser should be lower than the impurity concentration in a p-type $(Al_{0.7}Ga_{0.3})_{0.51}In_{0.49}P$ first cladding layer 135 of the red laser described later in this embodiment. Thus, since the impurity concentration in the first cladding layer 105 of the infrared laser is lower, the diffusion of the impurity into the active layer 104 can be suppressed, so as to prevent reliability degradation. At this point, when the multilayered structure of the infrared laser including the p-type $(Al_{0.7}Ga_{0.3})_{0.51}In_{0.49}P$ first cladding layer 105 is formed prior to a multilayered structure of the red laser including the p-type $(Al_{0.7}Ga_{0.3})_{0.51}In_{0.49}P$ first cladding layer 135, it is advantageous in the reliability of the red laser. The reason is as follows: If the multilayered structure of the red laser is priorly formed, the impurity diffusion from the first cladding layer 135 to an active layer 134 is accelerated because the impurity concentration in the p-type $(Al_{0.7}Ga_{0.3})_{0.51}In_{0.49}P$ first cladding layer 135 of the red laser is high and the first cladding layer 135 is excessively exposed to heat applied for forming the multilayered structure of the infrared laser formed after forming the multilayered structure of the red laser. As a result, the reliability of the red laser is degraded. Accordingly, in consideration of the reliability, it is necessary to satisfy the relationship of the impurity concentration in the first cladding layer 105 of the infrared laser<the impurity concentration in the first cladding layer 135 of the red laser and to form the multilayered structure of the infrared laser prior to the multilayered structure of the red laser.

Figure 5B:
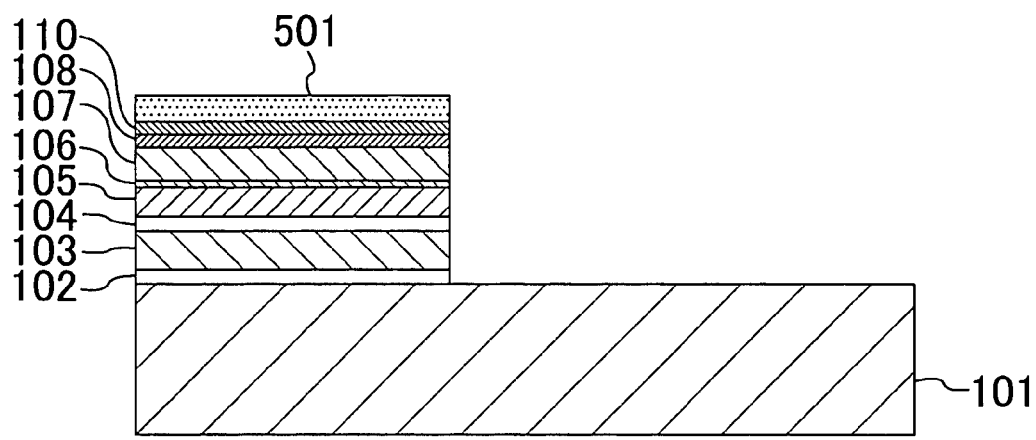

Next, after taking out the substrate 101 from an MOCVD reactor or an MBE reactor, a resist pattern 501 is formed in an infrared laser forming region by photolithography, and thereafter, the contact layer 110, the intermediate layer 108, the p-type second cladding layer 107, the etching stopper layer 106, the p-type first cladding layer 105, the active layer 104, the n-type cladding layer 103 and the buffer layer 102 are removed with a sulfate-based or hydrochloride-based etchant in a region not masked with the resist pattern 501 by using the resist pattern 501 as a mask as shown in FIG. 5B.

Figure 5C:
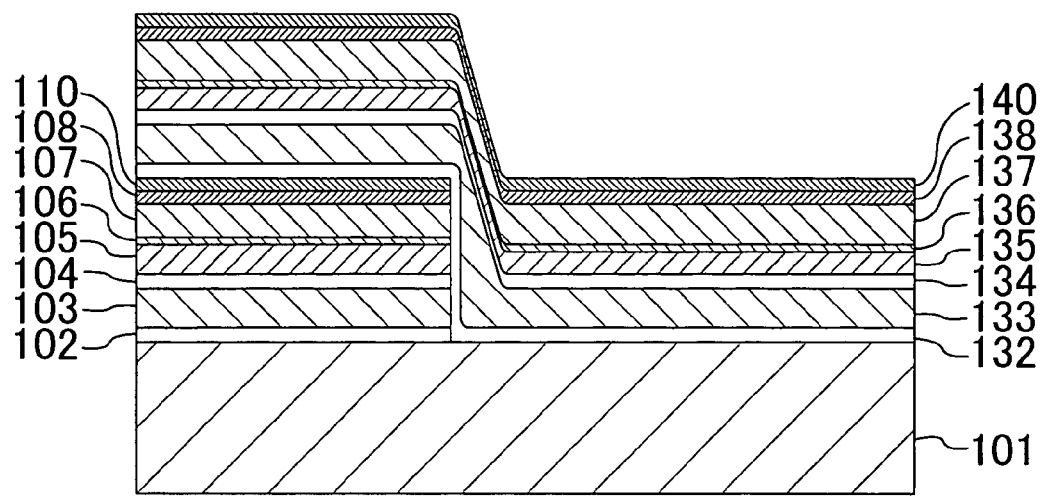

Next, after removing the resist pattern 501, an n-type GaAs buffer layer 132 (with a thickness of 1.2 μm), an n-type $(Al_{0.7}Ga_{0.3})_{0.51}In_{0.49}P$ cladding layer 133 (with a thickness of 1.2 μm), the quantum well active layer 134 (specifically, a multilayered body including an $(Al_{0.5}Ga_{0.5})_{0.51}In_{0.49}P$ guiding layer 1350g (with a thickness of 700 Å), a $Ga_{0.43}In_{0.57}P$ well layer 1349w (with a thickness of 60 Å), an $(Al_{0.5}Ga_{0.5})_{0.51}In_{0.49}P$ barrier layer 1348b (with a thickness of 60 Å), a $Ga_{0.43}In_{0.57}P$ well layer 1347w (with a thickness of 60 Å), an $(Al_{0.5}Ga_{0.5})_{0.51}In_{0.49}P$ barrier layer 1346b (with a thickness of 60 Å), a $Ga_{0.43}In_{0.57}P$ well layer 1345w (with a thickness of 60 Å), an $(Al_{0.5}Ga_{0.5})_{0.51}In_{0.49}P$ barrier layer 1344b (with a thickness of 60 Å), a $Ga_{0.43}In_{0.57}P$ well layer 1343w (with a thickness of 60 Å), an $(Al_{0.5}Ga_{0.5})_{0.51}In_{0.49}P$ barrier layer 1342b (with a thickness of 60 Å), a $Ga_{0.43}In_{0.57}P$ well layer 1341w (with a thickness of 60 Å) and an $(Al_{0.5}Ga_{0.5})_{0.51}In_{0.49}P$ guiding layer 1340g (with a thickness of 700 Å)), the p-type $(Al_{0.7}Ga_{0.3})_{0.51}In_{0.49}P$ first cladding layer 135 (with a thickness of 0.41 μm), a p-type GaInP etching stopper layer 136 (with a thickness of 60 Å), a p-type $(Al_{0.7}Ga_{0.3})_{0.51}In_{0.49}P$ second cladding layer 137 (with a thickness of 0.58 μm), a p-type $Ga_{0.51}In_{0.49}P$ intermediate layer 138 (with a thickness of 0.1 μm) and a p-type GaAs contact layer 140 (with a thickness of 0.2 μm) are formed on the n-type GaAs substrate 101 by the MOCVD or MBE method as shown in FIG. 5C.

Figure 6A:
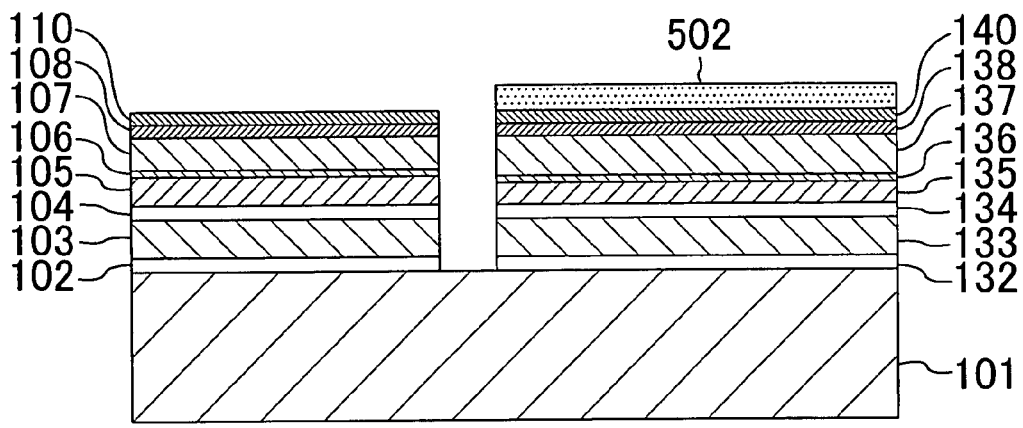
FIGS. 6A through 6C are cross-sectional views for showing other procedures in the method for fabricating a semiconductor laser device according to the embodiment of the invention.

Next, after taking out the substrate 101 from an MOCVD reactor or an MBE reactor, a resist pattern 502 is formed in a red laser forming region by the photography. Thereafter, the contact layer 140, the intermediate layer 138, the p-type second cladding layer 137, the etching stopper layer 136, the p-type first cladding layer 135, the active layer 134, the n-type cladding layer 133 and the buffer layer 132 are removed with a sulfate-based or hydrochloride-based etchant in a region not masked with the resist pattern 502 by using the resist pattern 502 as a mask as shown in FIG. 6A.

Figure 6B:
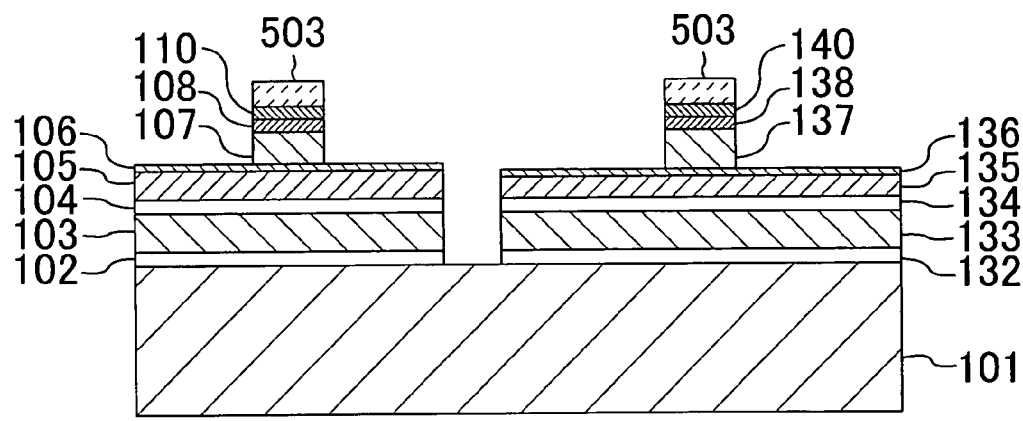

Next, after removing the resist pattern 502, a silicon oxide film 503 with a thickness of, for example, 0.3 μm is deposited on the p-type GaAs contact layers 110 and 140 under atmospheric pressure by a thermal CVD method (at, for example, 370° C.), and thereafter, the silicon oxide film 503 is patterned by the photolithography and dry etching into a mask in a stripe shape as shown in FIG. 6B. Subsequently, by using the thus formed silicon oxide film 503 in the stripe shape as a mask, the p-type GaAs contact layers 110 and 140, the p-type GaInP intermediate layers 108 and 138 and the p-type AlGaInP second cladding layers 107 and 137 are successively selectively etched. Thus, mesa-shaped ridges are formed in the infrared laser forming region and the red laser forming region on the substrate 101 with a hetero structure.

It is noted that wet etching may be employed instead of the dry etching or a combination of the dry etching and the wet etching may be employed in forming the mesa-shaped ridges.

Figure 6C:
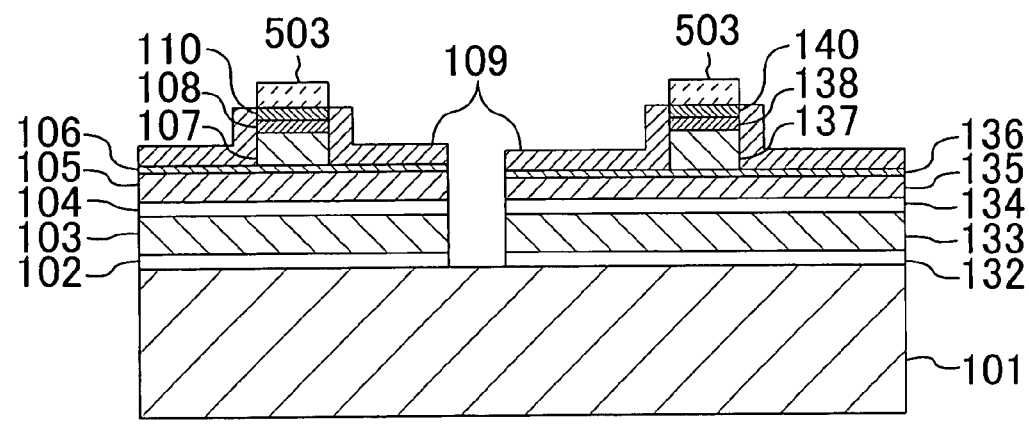

Next, after the substrate 101 is placed in an MOCVD reactor or an MBE reactor again, an n-type GaAs current confining layer 109 (with a thickness of 0.3 μm) is selectively grown by using the silicon oxide film 503 as a mask as shown in FIG. 6C.

Figure 7:
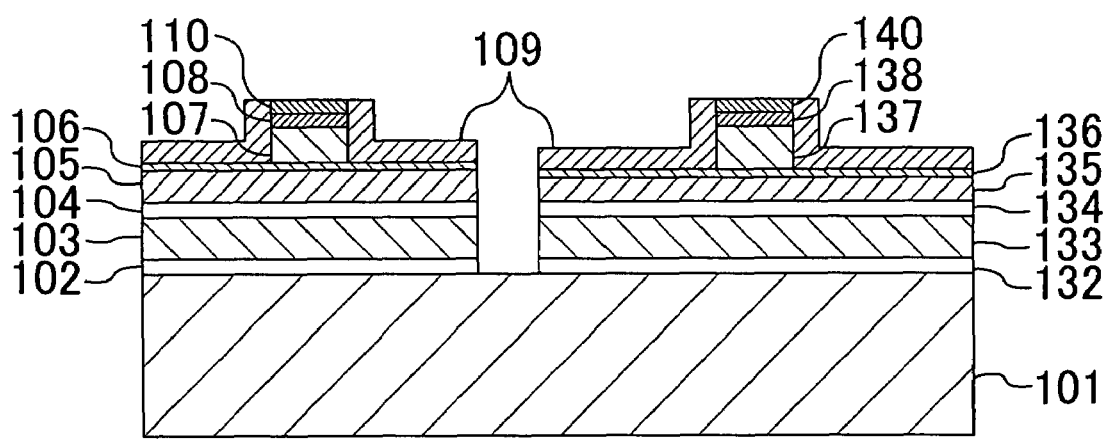
FIG. 7 is a cross-sectional view for showing another procedure in the method for fabricating a semiconductor laser device according to the embodiment of the invention.

Next, after taking out the substrate 101 from the MOCVD reactor or the MBE reactor, the silicon oxide film 503 is removed by using, for example, a hydrofluoric acid-based etchant as shown in FIG. 7. In this manner, the dual wavelength semiconductor laser device according to the embodiment of the invention can be obtained.

As described so far, according to this embodiment, the p-type cladding layers have different impurity concentrations in the respectively double hetero structures of the red laser and the infrared laser, and therefore, the impurity concentrations in the respective p-type cladding layers can be optimized so that stable self oscillation can be kept while suppressing current spread in the lateral direction in the respective active layers (namely, while stably forming saturable absorbers) and that the temperature characteristic and the reliability can be secured. Accordingly, an integrated type semiconductor laser device including a plurality of semiconductor laser diodes in each of which the longitudinal mode can stably retain a multimode oscillation (including self oscillation) characteristic, a temperature characteristic and reliability in a wide temperature range from a low temperature to a high temperature can be obtained.

Although the dual wavelength semiconductor laser device of the red and infrared wavelengths is described in this embodiment, the (number of kinds of and combination of emission wavelengths are not particularly specified. Specifically, although a red laser is used as a light emitting element for emitting light of a relatively short wavelength, another laser may be used instead. Also, although an infrared laser is used as a light emitting element for emitting light of a relatively long wavelength, another laser may be used instead.

Furthermore, it goes without saying that materials of the semiconductor layers such as the active layers and the cladding layers and the material of the substrate are not particularly specified in this embodiment. Specifically, although $(Al_{0.7}Ga_{0.3})_{0.51}In_{0.49}P$ is used for the n-type (AlGa)InP cladding layer 103, the p-type (AlGa)InP first cladding layer 105 and the p-type (AlGa)InP second cladding layer 107 of the infrared laser, the material of these cladding layers 103, 105 and 107 of the infrared laser is not particularly specified. However, the material of the cladding layers 103, 105 and 107 of the infrared laser is preferably the same as the material of the n-type (AlGa)InP cladding layer 133, the p-type (AlGa)InP first cladding layer 135 and the p-type (AlGa)InP second cladding layer 137 of the red laser. In the case where $(Al_{0.7}Ga_{0.3})_{0.51}In_{0.49}P$ is used as the material of these cladding layers, the operation current obtained at a high temperature (of, for example, 85° C.) can be reduced as compared with the case where, for example, AlGaAs including GaAs is used. Moreover, in the case where the same material is used for the ridges of the red laser and the infrared laser (namely, the p-type second cladding layers 107 and 137), these ridges can be simultaneously formed, and hence, the productivity can be improved.

Also, the same semiconductor layer is preferably formed on sidewalls of the ridges of the respective lasers in this embodiment. Thus, since light confining layers (current confining layers) can be formed on the sidewalls of the ridges through one crystal growing process, the number of crystal growth can be reduced, so as to simplify the fabrication process for the device.

Moreover, although the n-type GaAs current confining layer 109 is provided on both sides of the ridge stripes 111 and 141 in this embodiment, a current confining layer made of another semiconductor layer, such as an AlInP current confining layer, may be provided instead. Alternatively, instead of the n-type GaAs current confining layer 109, a dielectric layer such as a SiN layer, a $SiO_2$ layer, a $TiO_2$ layer or an $Al_2O_3$ layer, or a multilayered body including two or more of these layers may be formed on both sides of the ridge stripes 111 and 141.

INDUSTRIAL APPLICABILITY

According to the present invention, an integrated type semiconductor laser device in which the longitudinal mode can stably retain a multimode oscillation (including self oscillation) characteristic, a temperature characteristic and reliability in a wide temperature range from a low temperature to a high temperature can be realized, and in particular, the invention is very useful as a laser light source or the like in the field of optical disk systems required to be operated at a high temperature.

The invention claimed is:

1. A self oscillation type semiconductor laser device comprising:
    a first double hetero structure for emitting light of a first wavelength; and
    a second double hetero structure for emitting light of a second wavelength different from the first wavelength, the first double hetero structure and the second double hetero structure being provided on one semiconductor substrate of a first conductivity type, wherein:
    the first double hetero structure includes:
        a first first-conductivity type cladding layer;
        a first active layer having a plurality of well layers and formed on the first first-conductivity type cladding layer; and
        a first second-conductivity type cladding layer formed on the first active layer, the second double hetero structure includes:
        a second first-conductivity type cladding layer;
        a second active layer having a plurality of well layers and formed on the second first-conductivity type cladding layer; and
        a second second-conductivity type cladding layer formed on the second active layer,
    the first second-conductivity type cladding layer and the second second-conductivity type cladding layer are made of the same material and have different impurity concentrations,
    the first active layer is a quantum well active layer including GaAs,
    the second active layer is a quantum well active layer including GaInP,
    the total thickness of the well layers of the second active layer is larger than the total thickness of the well layers of the first active layer,
    the second second-conductivity type cladding layer has a smaller thickness than the first second-conductivity type cladding layer, and
    both of the first double hetero structure and the second double hetero structure cause self oscillation.

2. The self oscillation type semiconductor laser device of claim 1,
wherein the number of wells of the first active layer is three and the number of wells of the second active layer is five.

3. The self oscillation type semiconductor laser device of claim 1,
wherein the first first-conductivity type cladding layer, the first second-conductivity type cladding layer, the second first-conductivity type cladding layer and the second second-conductivity type cladding layer include AlGaInP.

4. The self oscillation type semiconductor laser device of claim 3,
wherein assuming that the impurity concentration in the first second-conductivity type cladding layer is Cp1 and that the impurity concentration in the second second-conductivity type cladding layer is Cp2, there is a relationship of Cp1<Cp2.

5. The self oscillation type semiconductor laser device of claim 1.
wherein assuming that the impurity concentration in the first second-conductivity type cladding layer is Cp1, there is a relationship of $Cp1 < 7 \times 10^{17}$ cm$^{-3}$.

6. The self oscillation type semiconductor laser device of claim 1,
wherein assuming that the impurity concentration in the second second-conductivity type cladding layer is Cp2, there is a relationship of $1 \times 10^{17}$ cm$^{-3}$ $< Cp2 < 8 \times 10^{17}$ cm$^{-3}$.

7. The self oscillation type semiconductor laser device of claim 3,
wherein assuming that the impurity concentration in the first second-conductivity type cladding layer is Cp1 and that the impurity concentration in the second second-conductivity type cladding layer is Cp2, there is a relationship of $1 \times 10^{17}$ cm$^{-3}$ $< Cp1 < Cp2 < 7 \times 10^{17}$ cm$^{-3}$.

8. The self oscillation type semiconductor laser device of claim 1,
wherein a first ridge is formed in the first second-conductivity type cladding layer, and
a second ridge is formed in the second second-conductivity type cladding layer.

9. The self oscillation type semiconductor laser device of claim 8,
wherein a current confining layer is formed on each of sidewalls of the first ridge and the second ridge.

10. The self oscillation type semiconductor laser device of claim 9,
wherein the current confining layer is made of GaAs.

* * * * *